United States Patent
Yen et al.

(10) Patent No.: US 9,911,611 B2
(45) Date of Patent: Mar. 6, 2018

(54) METHOD OF FORMING OPENINGS IN A MATERIAL LAYER

(71) Applicant: Taiwan Semiconductor Manufacturing Co., Ltd., Hsin-Chu (TW)

(72) Inventors: Yung-Sung Yen, New Taipei (TW); Ru-Gun Liu, Hsinchu County (TW); Chieh Chih Huang, Hsin-Chu (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 0 days.

(21) Appl. No.: 15/072,549

(22) Filed: Mar. 17, 2016

(65) Prior Publication Data

US 2017/0271160 A1    Sep. 21, 2017

(51) Int. Cl.
   *H01L 21/263*    (2006.01)
   *H01L 21/768*    (2006.01)

(52) U.S. Cl.
   CPC .... *H01L 21/2633* (2013.01); *H01L 21/76802* (2013.01); *H01L 21/76829* (2013.01)

(58) Field of Classification Search
   CPC ........... H01L 21/2633; H01L 21/76802; H01L 21/76829
   See application file for complete search history.

(56) References Cited

U.S. PATENT DOCUMENTS

| | | |
|---|---|---|
| 7,667,271 B2 | 2/2010 | Yu et al. |
| 7,910,453 B2 | 3/2011 | Xu et al. |
| 8,039,179 B2 | 10/2011 | Shieh et al. |
| 8,202,681 B2 | 6/2012 | Lin et al. |
| 8,377,779 B1 | 2/2013 | Wang |
| 8,399,931 B2 | 3/2013 | Liaw et al. |
| 8,652,894 B2 | 2/2014 | Lin et al. |
| 8,686,516 B2 | 4/2014 | Chen et al. |
| 8,716,765 B2 | 5/2014 | Wu et al. |
| 8,723,272 B2 | 5/2014 | Liu et al. |
| 8,728,332 B2 | 5/2014 | Lin et al. |
| 8,729,627 B2 | 5/2014 | Cheng et al. |
| 8,735,993 B2 | 5/2014 | Lo et al. |
| 8,736,056 B2 | 5/2014 | Lee et al. |
| 8,772,109 B2 | 7/2014 | Colinge |
| 8,785,285 B2 | 7/2014 | Tsai et al. |
| 8,816,444 B2 | 8/2014 | Wann et al. |

(Continued)

*Primary Examiner* — Nadine Norton
*Assistant Examiner* — Mahmoud Dahimene
(74) *Attorney, Agent, or Firm* — Haynes and Boone, LLP

(57) ABSTRACT

A method of fabricating a semiconductor device includes forming a hard mask (HM) mandrel along a first direction over a material layer, forming a first spacer along a sidewall of the HM mandrel, forming a second spacer along a sidewall of the first spacer and forming a patterned photoresist layer having a first line opening over the HM mandrel, the first spacer and the second spacer. First portions of the HM mandrel, the first spacer and the second spacer are exposed within the first line opening. The method also includes removing the first portion of the first spacer through the first line opening to expose a first portion of the material layer and etching the exposed first portion of the material layer to form a first opening in the material layer by using the exposed first portions of the HM mandrel and the second spacer as a sub-etch-mask.

20 Claims, 17 Drawing Sheets

(56) References Cited

U.S. PATENT DOCUMENTS

| | | |
|---|---|---|
| 8,822,243 B2 | 9/2014 | Yan et al. |
| 8,823,065 B2 | 9/2014 | Wang et al. |
| 8,860,148 B2 | 10/2014 | Hu et al. |
| 2006/0091468 A1 | 5/2006 | Liaw |
| 2011/0281208 A1 | 11/2011 | Lin et al. |
| 2012/0278776 A1 | 11/2012 | Lei et al. |
| 2013/0295769 A1 | 11/2013 | Lin et al. |
| 2013/0320451 A1 | 12/2013 | Liu et al. |
| 2014/0001574 A1 | 1/2014 | Chen et al. |
| 2014/0110755 A1 | 4/2014 | Colinge |
| 2014/0151812 A1 | 6/2014 | Liaw |
| 2014/0193974 A1 | 7/2014 | Lee et al. |
| 2014/0215421 A1 | 7/2014 | Chen et al. |
| 2014/0242794 A1 | 8/2014 | Lin et al. |
| 2014/0264760 A1 | 9/2014 | Chang et al. |
| 2014/0264899 A1 | 9/2014 | Chang et al. |
| 2014/0273442 A1 | 9/2014 | Liu et al. |
| 2014/0273446 A1 | 9/2014 | Huang et al. |
| 2015/0155198 A1* | 6/2015 | Tsai ............... H01L 21/76802 438/674 |
| 2016/0307769 A1* | 10/2016 | Tseng ............. H01L 21/31144 |

\* cited by examiner

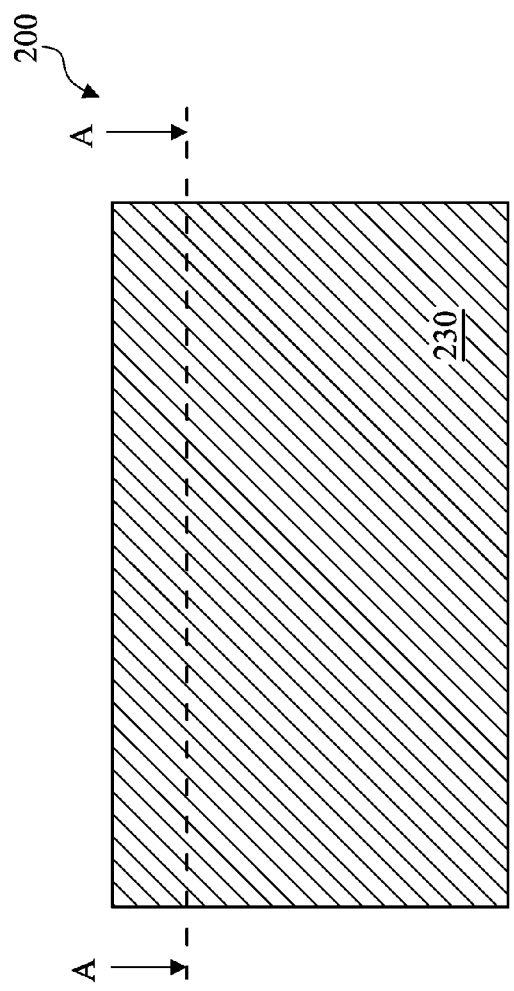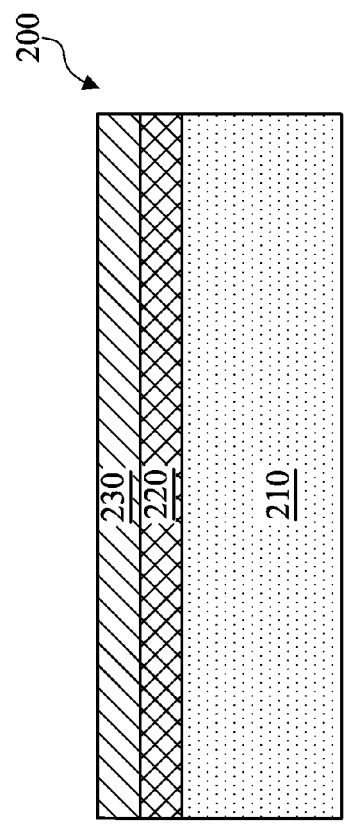

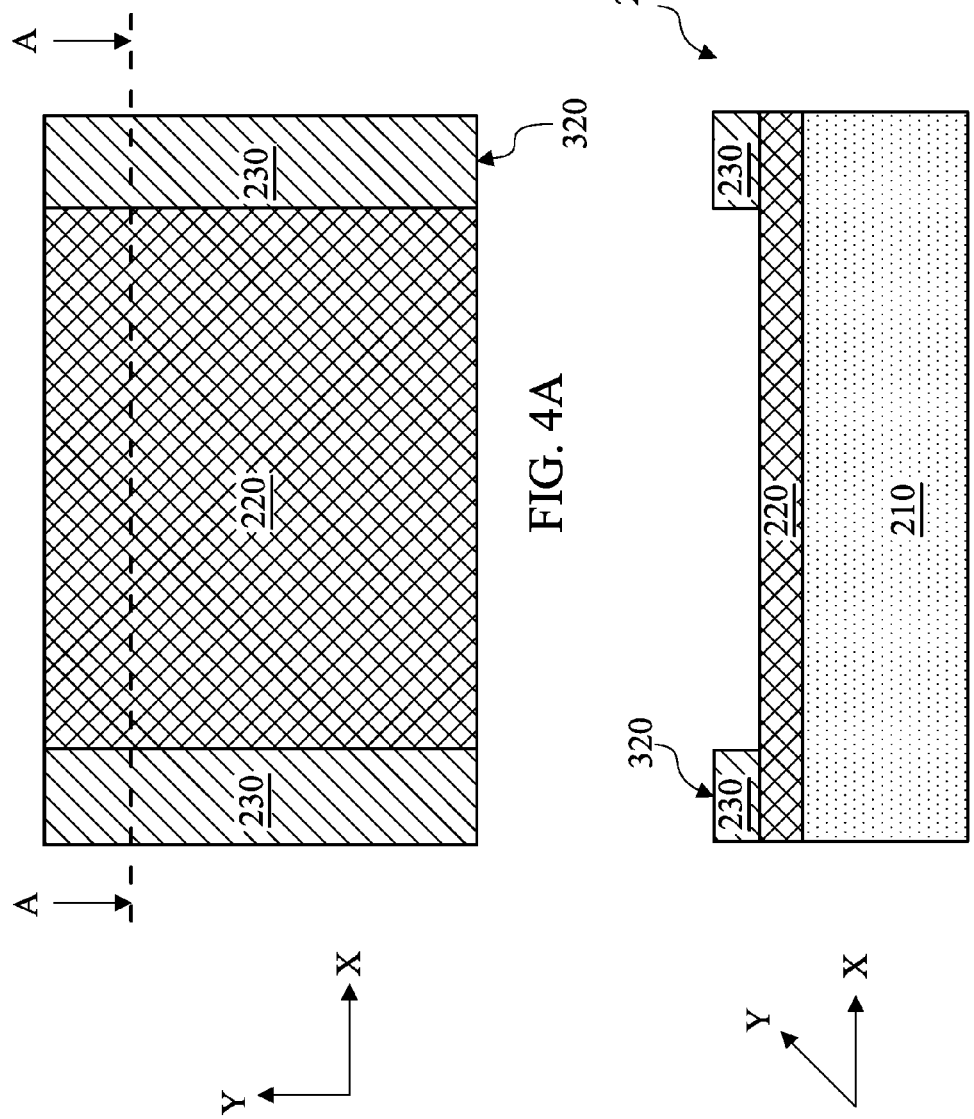

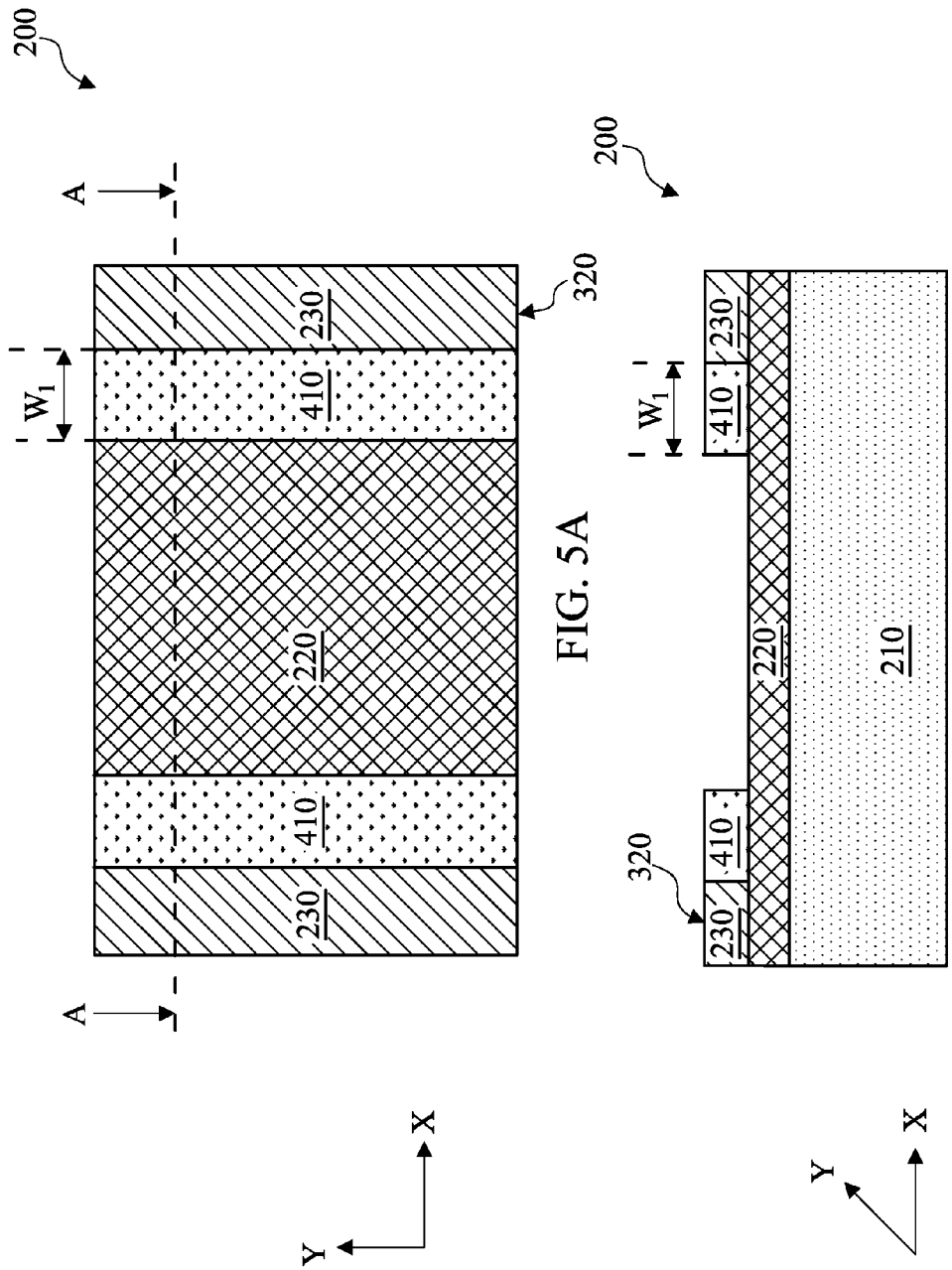

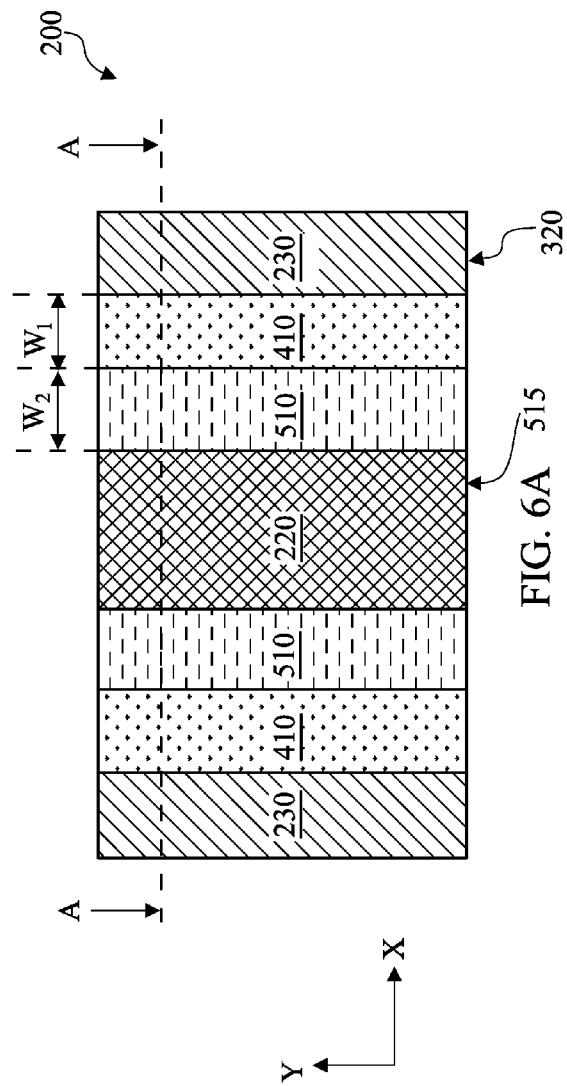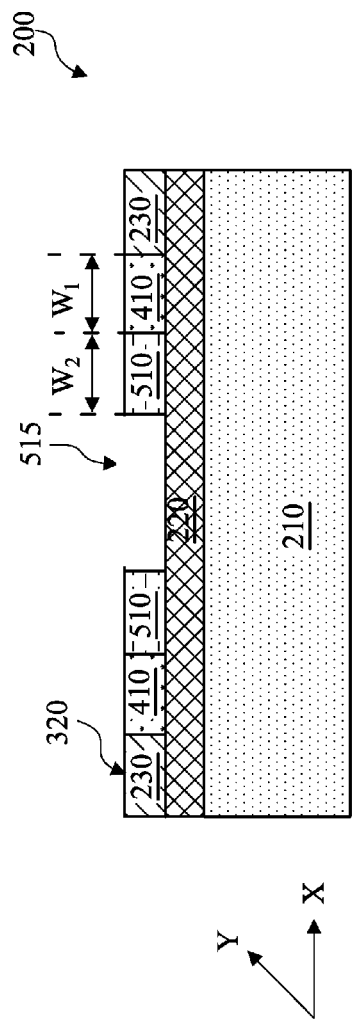

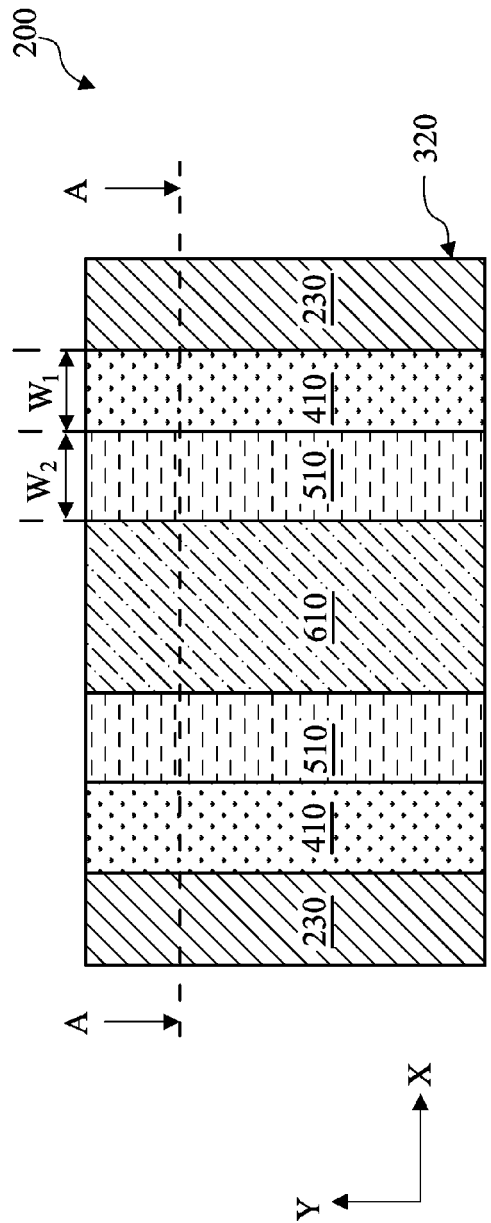
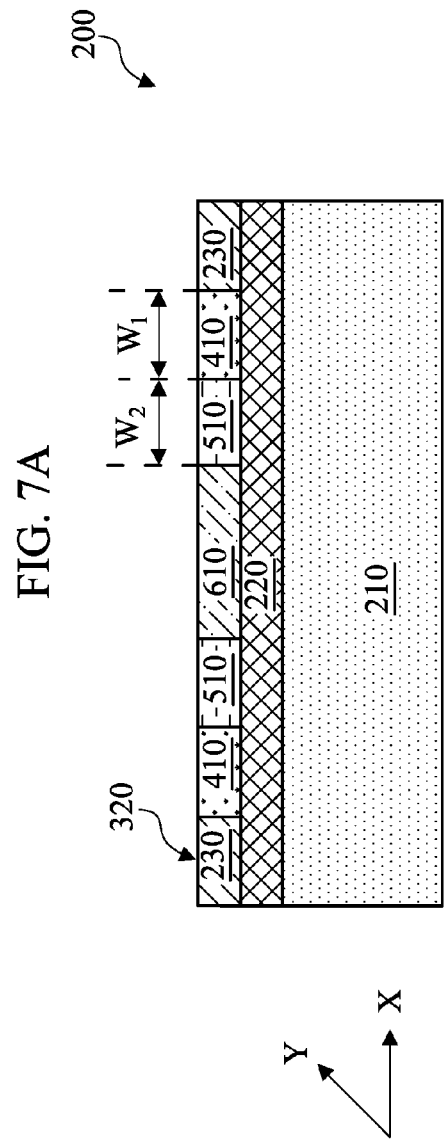
FIG. 7A
FIG. 7B

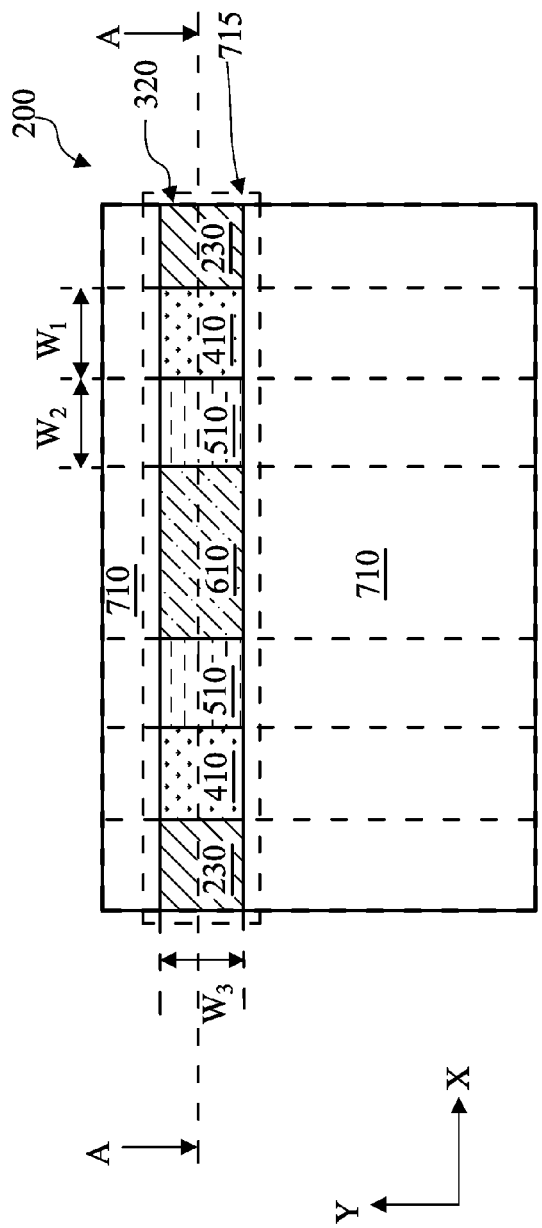
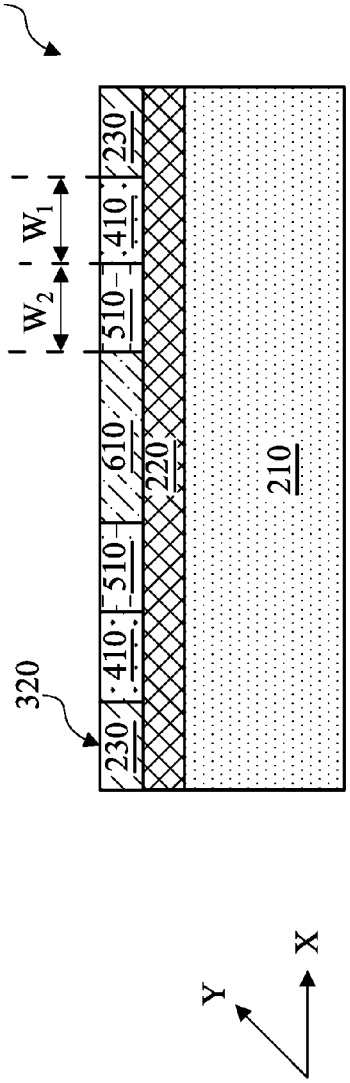

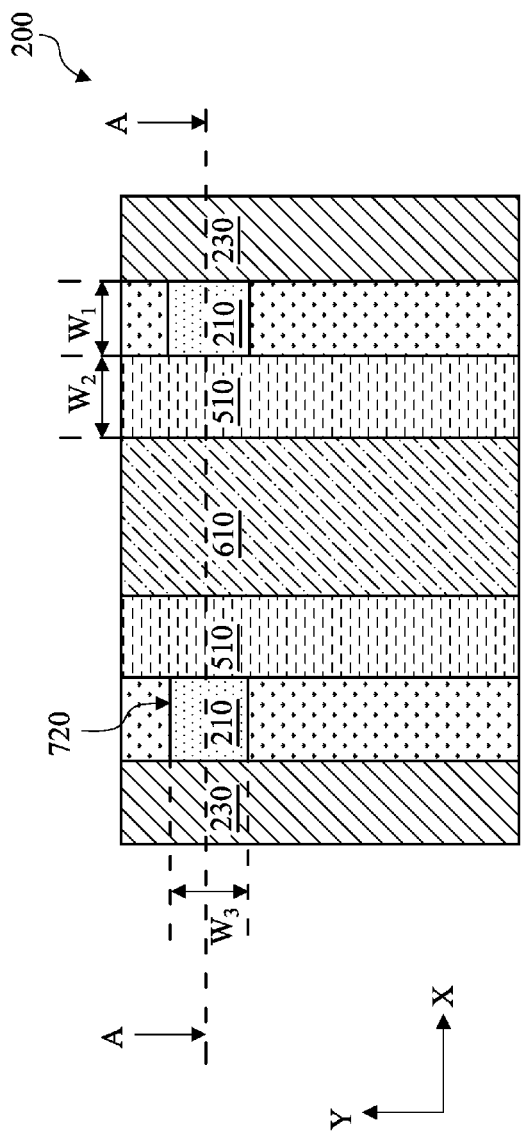
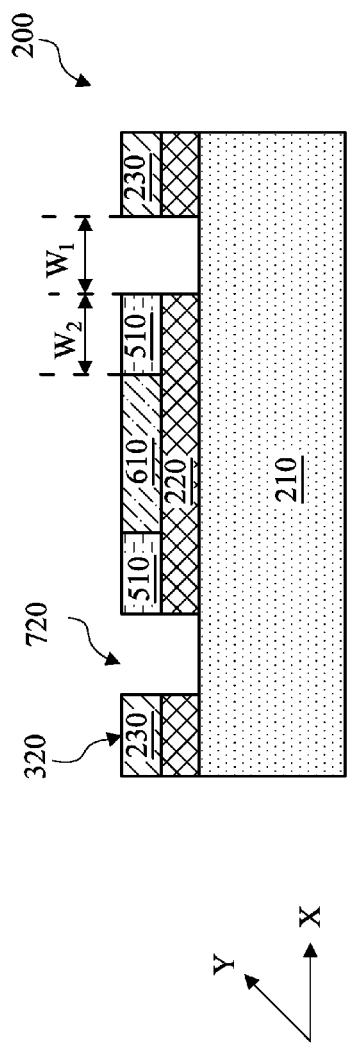
FIG. 9C
FIG. 9D

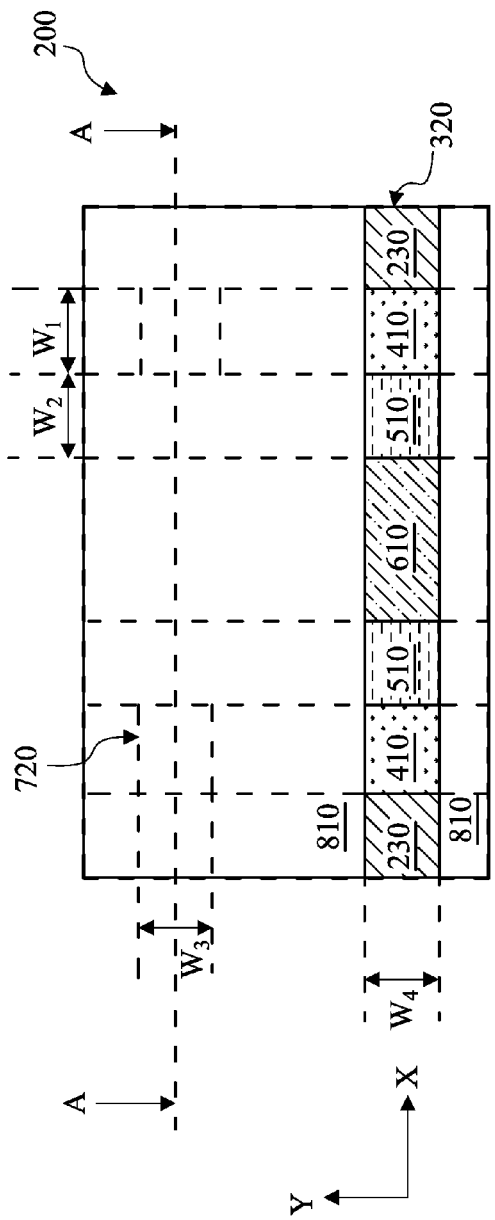
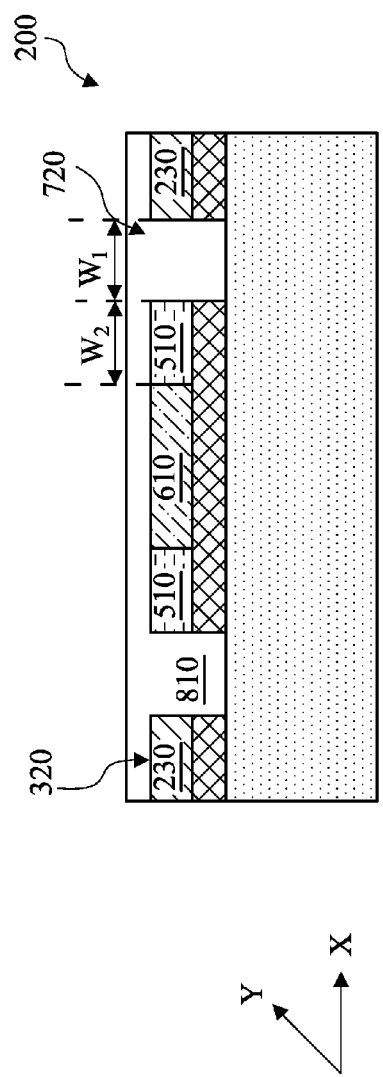
FIG. 10A
FIG. 10B

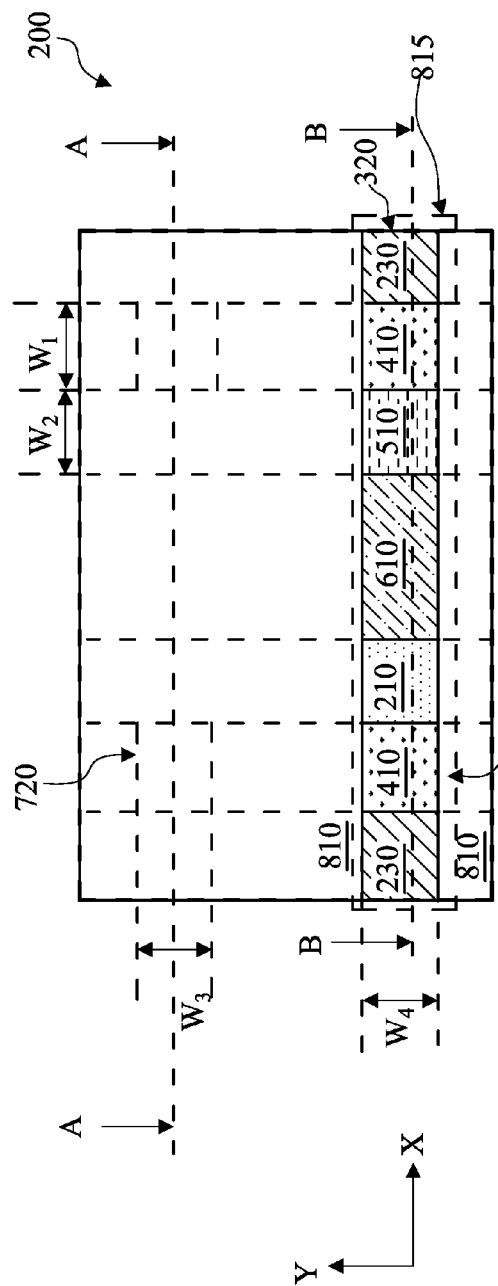
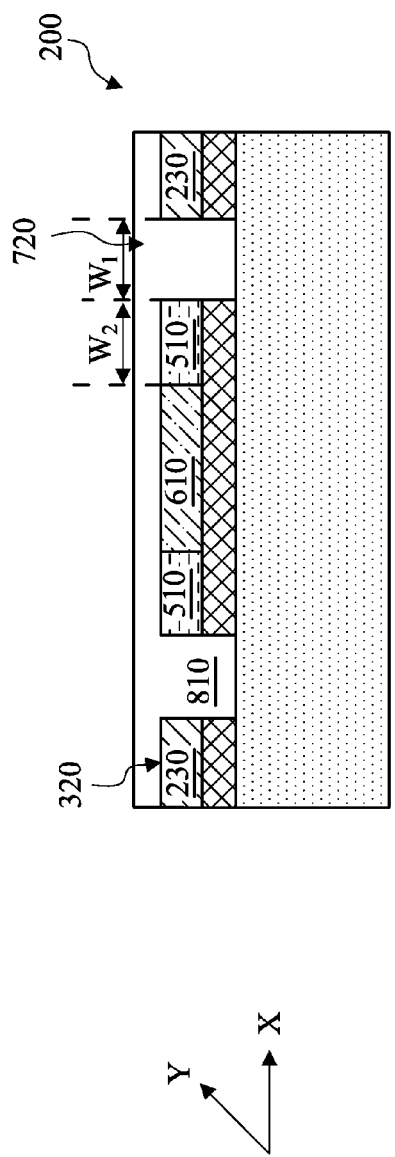
FIG. 11A
FIG. 11B

METHOD OF FORMING OPENINGS IN A MATERIAL LAYER

BACKGROUND

The semiconductor integrated circuit (IC) industry has experienced rapid growth. Technological advances in IC design and material have produced generations of ICs where each generation has smaller and more complex circuits than previous generation. In the course of IC evolution, functional density (i.e., the number of interconnected devices per chip area) has generally increased while geometry size (i.e., the smallest component (or line) that can be created using a fabrication process) has decreased.

This scaling down process generally provides benefits by increasing production efficiency and lowering associated costs. Such scaling down has also increased the complexity of IC processing and manufacturing. For these advances to be realized, similar developments in IC processing and manufacturing are needed. Although existing methods of fabricating IC devices have been generally adequate for their intended purposes, they have not been entirely satisfactory in all respects. For example, improvements in forming smaller features with a relaxed lithography process are desired.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A. 3A. 4A. 5A, 6A, 7A, 8A, 9A, 9C, 10A, 11A, 11D and 12A are top views of an example semiconductor device in accordance with some embodiments.

FIGS. 2B. 3B. 4B. 5B, 6B, 7B, 8B, 9B, 9D, 10B, 11B, 11E and 12B are cross-sectional views of an example semiconductor device in accordance with some embodiments, along the line A-A in FIGS. 2A. 3A. 4A. 5A, 6A, 7A, 8A, 9A, 9C, 10A, 11A, 11D, 12A and 13, respectively.

DETAILED DESCRIPTION

Figure 1:
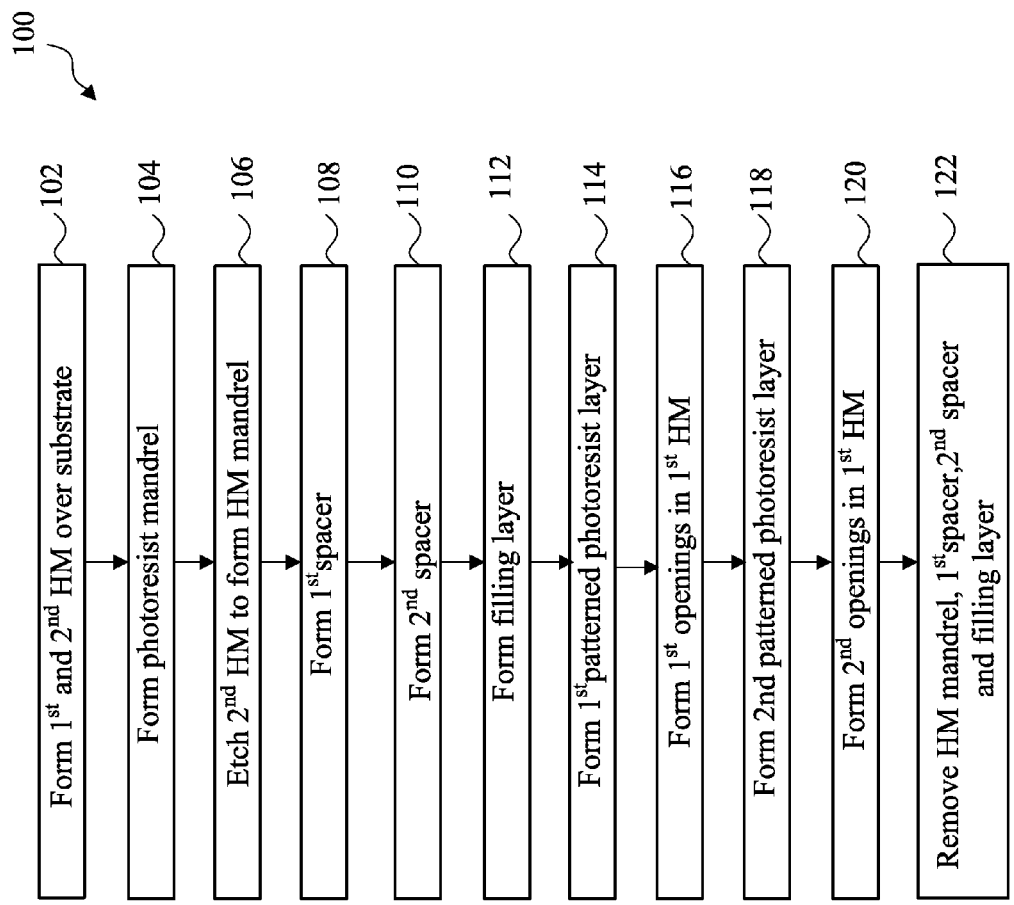
FIG. 1 is a flowchart of an example method for fabricating a semiconductor device constructed in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a flowchart of a method 100 of fabricating one or more semiconductor devices in accordance with some embodiments. The method 100 is discussed in detail below, with reference to a semiconductor device 200, shown in FIGS. 2A through 13.

Referring to FIGS. 1, 2A and 2B, method 100 begins at step 102 by forming a first hard mask (HM) layer 220 and a second HM layer 230 over a substrate 210. The substrate 210 includes silicon. Alternatively or additionally, the substrate 210 may include other elementary semiconductor such as germanium. The substrate 210 may also include a compound semiconductor such as silicon carbide, gallium arsenic, indium arsenide, and indium phosphide. The substrate 210 may include an alloy semiconductor such as silicon germanium, silicon germanium carbide, gallium arsenic phosphide, and gallium indium phosphide. In one embodiment, the substrate 210 includes an epitaxial layer. For example, the substrate 210 may have an epitaxial layer overlying a bulk semiconductor. Furthermore, the substrate 210 may include a semiconductor-on-insulator (SOI) structure. For example, the substrate 210 may include a buried oxide (BOX) layer formed by a process such as separation by implanted oxygen (SIMOX) or other suitable technique, such as wafer bonding and grinding.

The substrate 210 may also include various p-type doped regions and/or n-type doped regions, implemented by a process such as ion implantation and/or diffusion. Those doped regions include n-well, p-well, light doped region (LDD) and various channel doping profiles configured to form various integrated circuit (IC) devices, such as a complimentary metal-oxide-semiconductor field-effect transistor (CMOSFET), imaging sensor, and/or light emitting diode (LED). The substrate 210 may further include other functional features such as a resistor or a capacitor formed in and on the substrate.

The substrate 210 may also include various isolation features. The isolation features separate various device regions in the substrate 210. The isolation features include different structures formed by using different processing technologies. For example, the isolation features may include shallow trench isolation (STI) features. The formation of a STI may include etching a trench in the substrate 210 and filling in the trench with insulator materials such as silicon oxide, silicon nitride, or silicon oxynitride. The filled trench may have a multi-layer structure such as a thermal oxide liner layer with silicon nitride filling the trench. A chemical mechanical polishing (CMP) may be performed to polish back excessive insulator materials and planarize the top surface of the isolation features.

The substrate 210 may also include gate stacks formed by dielectric layers and electrode layers. The dielectric layers may include an interfacial layer (IL) and a high-k (HK) dielectric layer deposited by suitable techniques, such as chemical vapor deposition (CVD), atomic layer deposition (ALD), physical vapor deposition (PVD), thermal oxidation, combinations thereof, or other suitable techniques. The IL may include oxide, HfSiO and oxynitride and the HK dielectric layer may include LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), and/or other suitable materials. The electrode layer may include a single layer or alternatively a multi-layer structure, such as various combinations of a metal layer with a work function to enhance the device performance (work function metal layer), liner layer, wetting layer, adhesion layer and a conductive layer of metal, metal alloy or metal silicide). The MG electrode 420 may include Ti, Ag, Al, TiAlN, TaC, TaCN, TaSiN, Mn, Zr, TiN, TaN, Ru, Mo, Al, WN, Cu, W, any suitable materials or a combination thereof.

The substrate 210 may also include a plurality of inter-level dielectric (ILD) layers and conductive features integrated to form an interconnect structure configured to couple the various p-type and n-type doped regions and the other functional features (such as gate electrodes), resulting a functional integrated circuit. In one example, the substrate 210 may include a portion of the interconnect structure and the interconnect structure includes a multi-layer interconnect (MLI) structure and an ILD layer integrated with a MLI structure, providing an electrical routing to couple various devices in the substrate 210 to the input/output power and signals. The interconnect structure includes various metal lines, contacts and via features (or via plugs). The metal lines provide horizontal electrical routing. The contacts provide vertical connection between silicon substrate and metal lines while via features provide vertical connection between metal lines in different metal layers.

The first and second HM layers, 220 and 230, may include silicon oxide, silicon nitride, oxynitride, silicon carbide, titanium oxide, titanium nitride, tantalum oxide, tantalum nitride, and/or any suitable materials. In the present embodiment, the second HM layer 230 includes a material which is different from first HM layer 220 to achieve etching selectivity in subsequent etches. The first HM layer 220 is deposited over the substrate 210 and the second HM layer 230 is deposited over the first HM layer 220. The first and second HM layers, 220 and 230, may be deposited by a suitable technique, such as thermal oxidation, chemical vapor deposition (CVD), atomic layer deposition (ALD), physical vapor deposition (PVD), combinations thereof, and/or other suitable techniques.

Figure 3A:
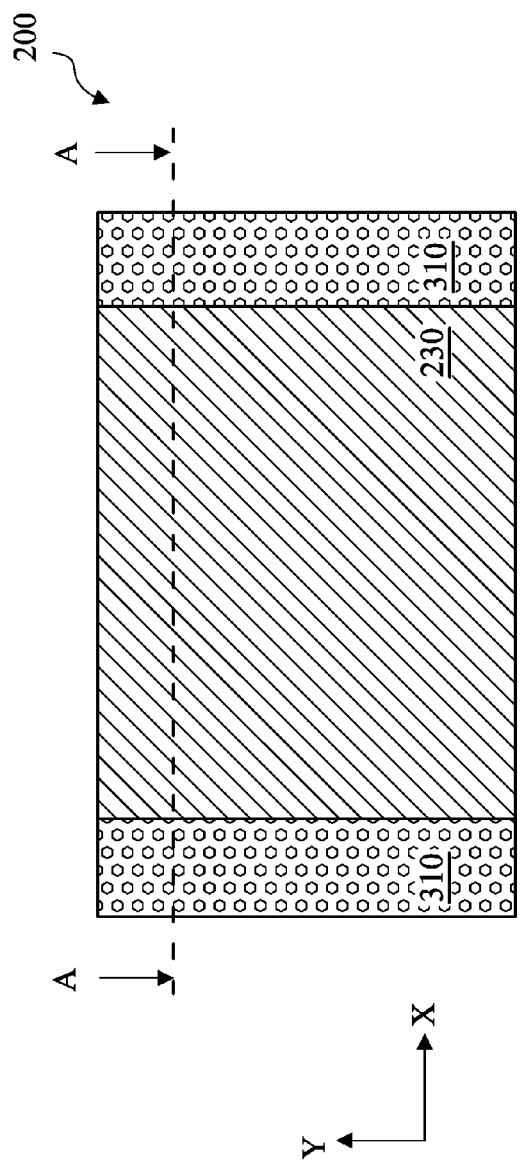
Figure 3B:
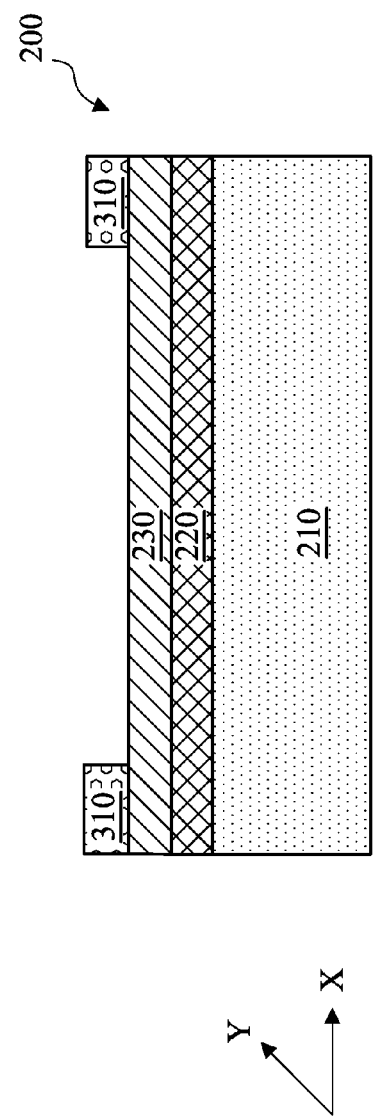

Referring to FIGS. 1, 3A and 3B, method 100 proceeds to step 104 by forming a plurality of photoresist features 310 (or patterned photoresist layer) over the second HM layer 230. The photoresist features 310 are also referred to as photoresist mandrels 310. In the present embodiment, the photo resist mandrels 310 are oriented in the Y direction and are spaced apart from one another along the X direction which is perpendicular to the Y direction.

The photoresist mandrels 310 may be formed by a lithography process. An exemplary lithography process may include forming a photoresist layer, exposing the photoresist layer by a lithography exposure process, performing a post-exposure bake process, and developing the photoresist layer to form the patterned resist layer.

Referring to FIGS. 1, 4A and 4B, method 100 proceeds to step 106 by etching the second HM layer 230 to form HM mandrels 320 (or patterned second HM layer). The HM layer 230 is etched by using the photoresist mandrel 310 as an etching mask. As has been mentioned previously, the etch process is chosen to selectively etch the second HM layer 230 without etching the first HM layer 220. The etch process may include a selective wet etch, a selective dry etch, and/or a combination thereof. After forming the HM mandrels 320, a resist strip process is then applied to remove the photoresist mandrels 310.

Referring to FIGS. 1, 5A and 5B, method 100 proceeds to step 108 by forming first spacers 410 along sidewalls of the HM mandrels 320. The first spacers 410 may be formed by depositing a first spacer material layer over the HM mandrels 320 which is followed by anisotropically etching the spacer material layer. The first spacer material layer may include silicon oxide, silicon nitride, oxynitride, silicon carbide, titanium oxide, titanium nitride, tantalum oxide, tantalum nitride, and/or any suitable materials. In the present embodiment, the first spacer material layer includes a material which is different from the HM mandrels 320 to achieve etch selectivity in subsequent etch processes. The first spacer layer may be deposited by CVD, ALD, PVD, or other suitable techniques. In one embodiment, the first spacer material layer is deposited by ALD to achieve conformable film coverage along the sidewalls of the HM mandrels 320. In some embodiments, the spacer material layer is etched by an anisotropic etch to form a vertical profile. The anisotropic etch may include a plasma etch in one example. It is noted that a first width $w_1$ of the first spacer 410 is defined by spacer deposition thickness, which can be controlled precisely by deposition process condition, such as deposition time.

Referring to FIGS. 1, 6A and 6B, method 100 proceeds to step 110 by forming second spacers 510 along sidewalls of the first spacers 410. The second spacers 510 may include silicon oxide, silicon nitride, oxynitride, silicon carbide, titanium oxide, titanium nitride, tantalum oxide, tantalum nitride, and/or any suitable materials. In the present embodiment, the second spacers 510 includes a material which is different from the first spacers 410 and the HM mandrels 320 to achieve etch selectivity in a subsequent etch. The second spacers 510 are formed similarly in many respects to the first spacers 410 discussed above association with FIGS. 5A and 5B. Similarly, a second width $w_2$ of the second spacer 510 is defined by precisely controlled spacer deposition thickness. In present embodiment, a space 515 is left between the two adjacent second spacers 510.

Referring to FIGS. 1, 7A and 7B, method 100 proceeds to step 112 by depositing a filling layer 610 in the space 515 such that the space 515 is filled in by the filling layer 610. The filling layer 610 may include silicon oxide, silicon nitride, silicon oxynitride, a low-k dielectric, silicon carbide, and/or other suitable materials. The filling layer 610 may be deposited by CVD, ALD, PVD, thermal oxidation, spin-on coating, combinations thereof, and/or other suitable techniques. In the present embodiment, the filling layer 610 includes a material which is different from the first spacers 410, the second spacers 510, the HM mandrels 320 and the first HM layer 220 to achieve etching selectivity in subsequent etches. In some embodiments, the filling layer 610 includes a same material as the HM mandrels 320. In the present embodiment, a chemical mechanical polishing (CMP) may be performed to polish back excessive filling layer 610 and expose the HM mandrel 320, the first spacers 410 and the second spacers 510.

Referring to FIGS. 1, 8A and 8B, method 100 proceeds to step 114 by forming a first patterned photoresist layer 710, which includes a first line-like opening 715 extending along the X direction. The first line-like opening 715 has a third width $w_3$. In the present embodiment, the third width $w_3$ is substantially smaller than a length of the first line-like opening 715. Therefore, the first line-like opening 710 is considered as a one-dimension (1D) pattern. There are less constrains in a lithography process to form a 1D pattern than to form a two-dimension (2D) pattern. The first patterned photoresist layer 710 is formed by a lithography process including coating, exposing and developing processes. Respective portions of the first HM mandrel 320, the first spacers 410, the second spacers 510 and the filling layer 610 are exposed within the first line-like opening 715.

Figure 9A:
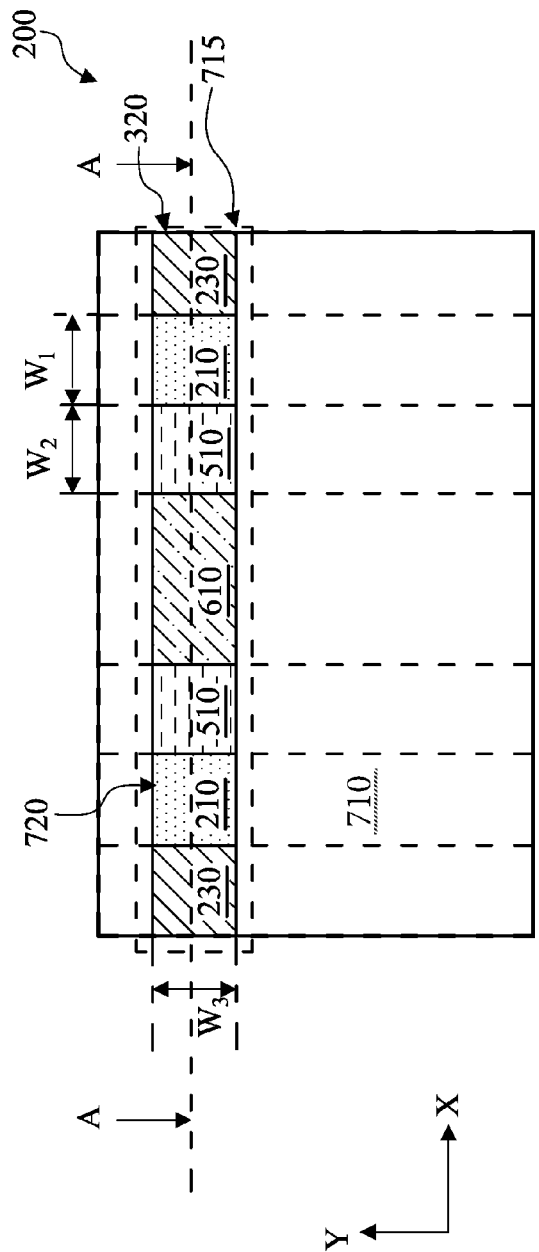
Figure 9B:
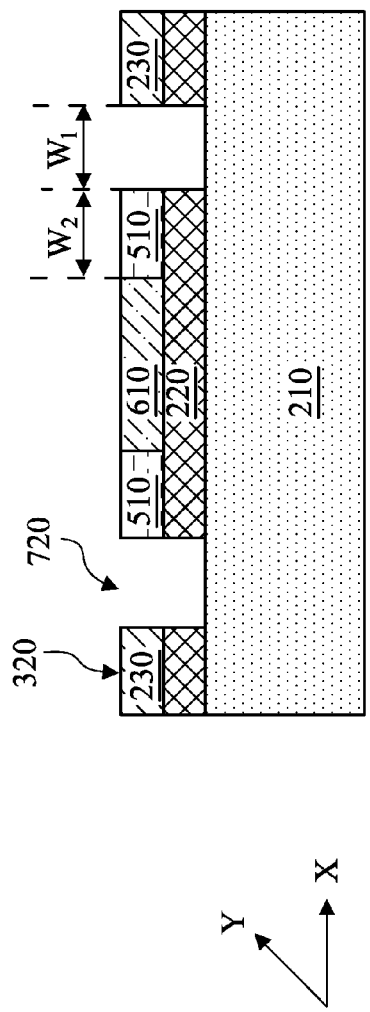

Referring to FIGS. 1, 9A and 9B, method 100 proceeds to step 116 by selectively etching the first spacers 410 through the first line-like opening 715 and continue etching the first HM layer 220 to form first rectangular opening 720 in the first HM layer 220. Respective portions of the substrate 210 are exposed within the first rectangular openings 720. As has been mentioned previously, the etch process is chosen to selectively etch the first spacers 410 and the first HM layer 220 without substantially etching the first HM mandrel 320, the second spacers 510 and the filling layer 610. As a result, the exposed portions of the HM mandrel and the second spacers 510 serve as a sub-etch-mask during etching of the first HM layer 220. Thus, with the sub-etch-mask, a two-dimension (2D) opening (namely the first rectangular opening 720) is achieved by the 1D line-like opening 715. The etch process may include a selective wet etch, a selective dry etch, and/or a combination thereof. As an example, a selective wet etching solution may include $HNO_3$, $NH_4OH$, KOH, HF, HCl, NaOH, $H_3PO_4$, TMAH, and/or other suitable selective wet etching solutions, and/or combinations thereof. Alternatively, a selective dry etching process may implement chlorine-containing gas (e.g., $Cl_2$, $CHCl_3$, $CCl_4$, and/or $BCl_3$), bromine-containing gas (e.g., HBr and/or $CHBr_3$), iodine-containing gas, fluorine-containing gas (e.g., $CF_4$, $SF_6$, $CH_2F_2$, $CHF_3$, and/or $C_2F_6$), and/or other suitable gases and/or plasmas, and/or combinations thereof. After forming the first rectangular openings 720, a resist strip process is then applied to remove the first patterned photoresist 710, as shown in FIGS. 9C and 9D.

As a result, the first rectangular opening 720 has the first width $w_1$ along X-direction and the third width w3 along Y-direction. It is noted that the first width $w_1$ is the width of the first spacer 410. Thus, the first rectangular opening 720 not only inherits good width control but also is formed by a 1D lithography patterning process, which has much more relaxed constraints as compared to a 2D lithography patterning process.

Referring to FIGS. 1, 10A and 10B, method 100 proceeds to step 118 by forming a second patterned photoresist layer 810, which includes second line-like openings 815 extending along the X direction. The second line-like openings 815 is located in a different position than the first openings 720 along Y-direction. Each of the second line-like opening 815 has a fourth width $w_4$. In the present embodiment, the second line-like opening 815 is also a 1D pattern. The second patterned photoresist layer 810 is formed similarly in many respects to the first patterned resist layer 710 discussed above association with FIGS. 8A and 8B, including the materials discussed therein. Respective portions of the HM mandrel 320, the first spacers 410, the second spacers 510 and the filling layer 610 are exposed within the second line-like opening 815.

Figure 11C:
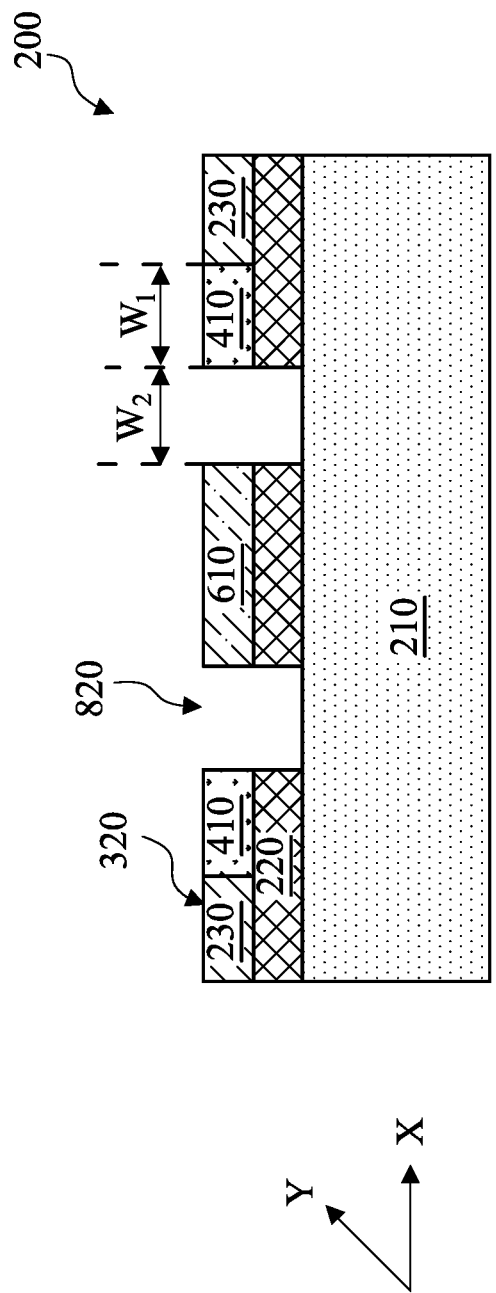
FIGS. 11C and 12C are cross-sectional views of an example semiconductor device in accordance with some embodiments, along the line B-B in FIGS. 11A and 12A, respectively.
Figure 11D:
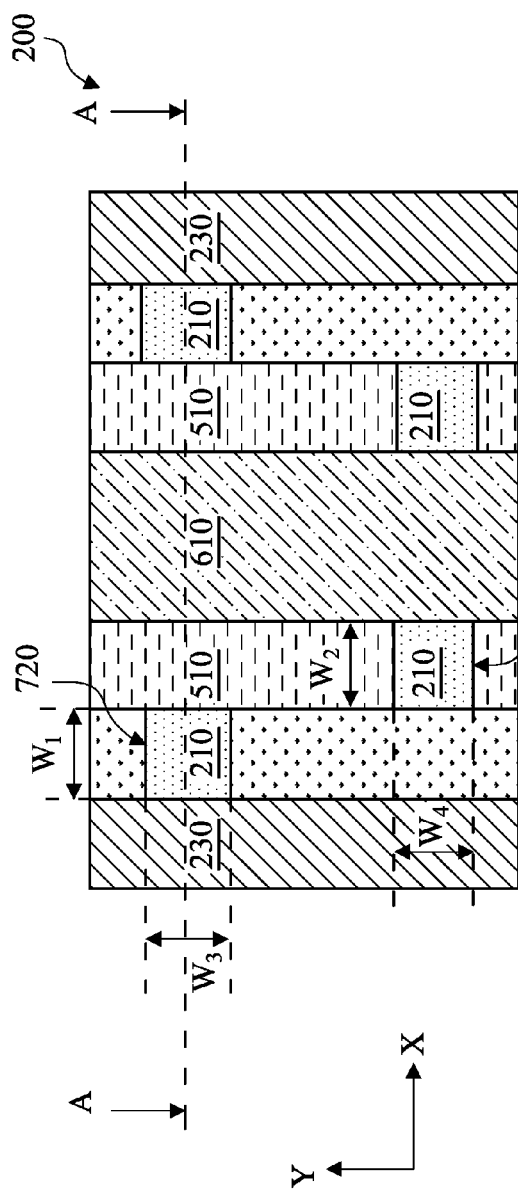
Figure 11E:
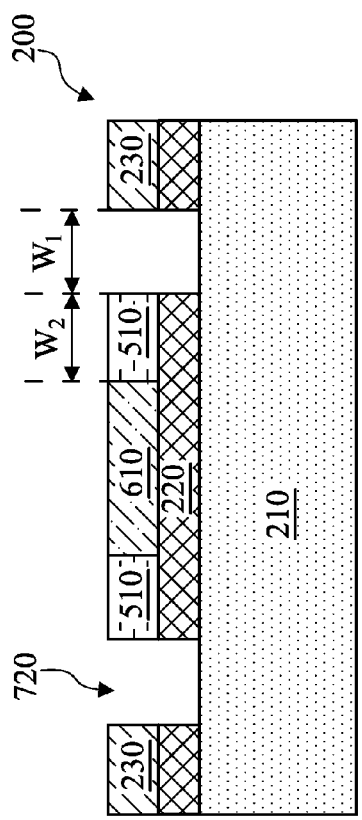
Figure 12A:
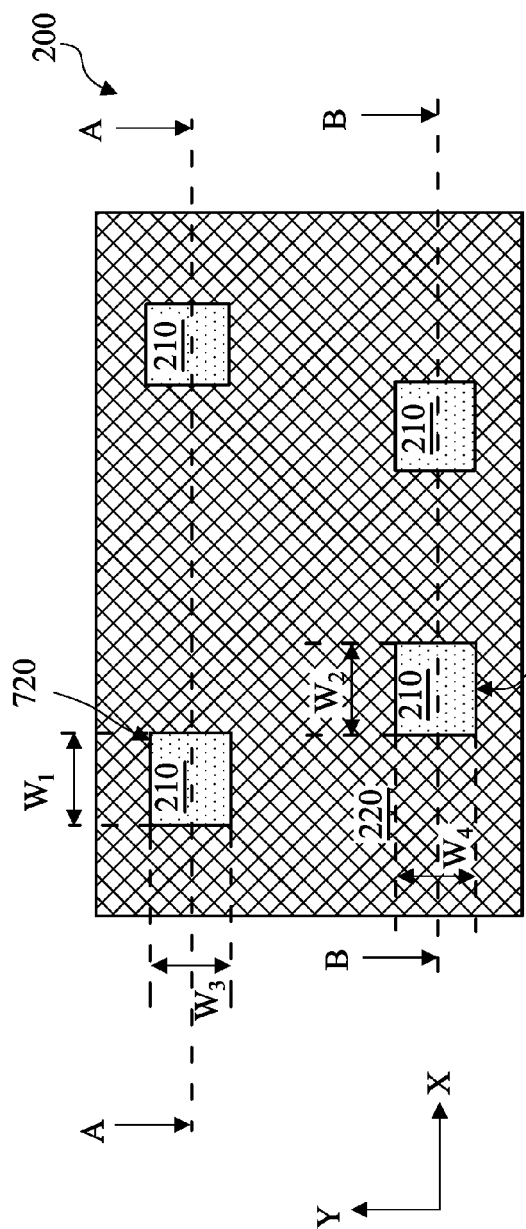
Figure 12B:
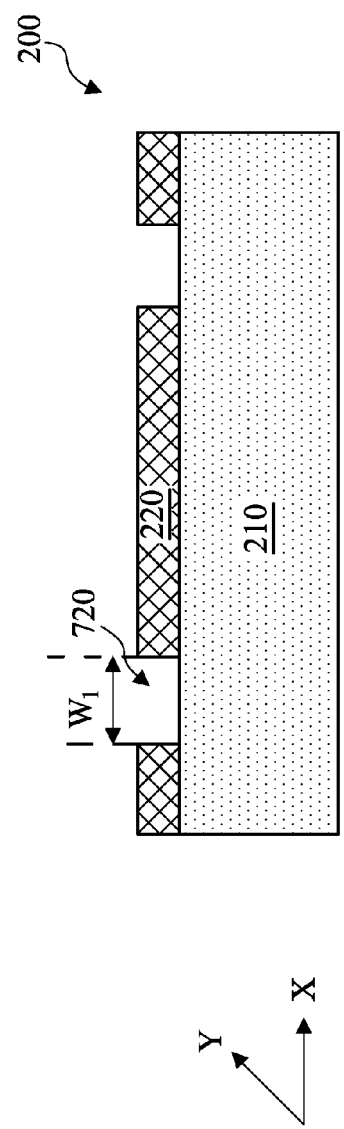
Figure 12C:
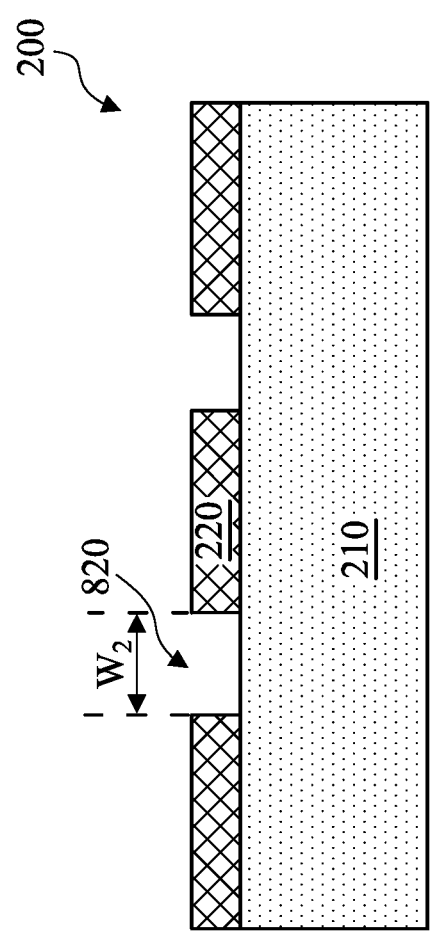

Referring to FIGS. 1, 11A, 11B and 11C, method 100 proceeds to step 120 by selectively etching the second spacers 510 through the second line-like opening 815 and continue etching the first HM layer 220 to form second rectangular openings 820 in the first HM layer 220. Respective portions of the substrate 210 are exposed within the second rectangular openings 820. As has been mentioned previously, the etch process is chosen to selectively etch the second spacers 510 and the first HM layer 220 without substantially etching the first HM mandrel 320, the first spacers 410 and the filling layer 610. As a result, the exposed portions of the first spacers 510 and the filling layer 610 serve as a sub-etch-mask during etching the first HM layer 220. Thus, with the sub-etch-mask, the 2D opening (namely the second rectangular opening 820) is achieved by the 1D line-like opening 815. The etch process may include a selective wet etch, a selective dry etch, and/or a combination thereof. As an example, a selective wet etching solution may include $HNO_3$, $NH_4OH$, KOH, HF, HCl, NaOH, $H_3PO_4$, TMAH, and/or other suitable selective wet etching solutions, and/or combinations thereof. Alternatively, a selective dry etching process may implement chlorine-containing gas (e.g., $Cl_2$, $CHCl_3$, $CCl_4$, and/or $BCl_3$), bromine-containing gas (e.g., HBr and/or $CHBr_3$), iodine-containing gas, fluorine-containing gas (e.g., $CF_4$, $SF_6$, $CH_2F_2$, $CHF_3$, and/or $C_2F_6$), and/or other suitable gases and/or plasmas, and/or combinations thereof. After forming the second rectangular openings 820, a resist strip process is then applied to remove the second patterned photoresist 810, as shown in FIGS. 11D and 11E.

As a result, each of the second rectangular openings 820 has the second width $w_2$ along X-direction and the fourth width $w_4$ along Y-direction. It is noted that the second width $w_2$ is the width of the second spacer 510 defined by spacer deposition thickness. Thus, the second rectangular openings 820 not only inherits good width control, but also is formed by a 1D lithography patterning process, which has much more relaxed constraints as compared to a 2D lithography patterning process.

Referring to FIGS. 1, 12A, 12B and 12C, method 100 proceeds to step 122 by selectively removing the HM mandrel 320, the first spacer 410, the second spacer 510 and the filling layer 610. The etch process is chosen to selectively etch the HM mandrel 320, the first spacer 410, the second spacer s 510 and the filling layer 6100 without substantially etching the first HM layer 220. The etch process may include a selective wet etch, a selective dry etch, and/or a combination thereof. As an example, a selective wet etching solution may include $HNO_3$, $NH_4OH$, KOH, HF, HCl, NaOH, $H_3PO_4$, TMAH, and/or other suitable selective wet etching solutions, and/or combinations thereof. Alternatively, a selective dry etching process may implement chlorine-containing gas (e.g., $Cl_2$, $CHCl_3$, $CCl_4$, and/or $BCl_3$), bromine-containing gas (e.g., HBr and/or $CHBr_3$), iodine-containing gas, fluorine-containing gas (e.g., $CF_4$, SF6, CH2F2, CHF3, and/or C2F6), and/or other suitable gases and/or plasmas, and/or combinations thereof.

As a result, the first HM 220 is patterned to have first rectangular openings 720 and second rectangular openings 820, referred to as a patterned HM 220'. In the present embodiment, first rectangular openings 720 align to each other along X-direction and second rectangular openings 820 align to each other also along X-direction but at a different location along Y-direction comparing to the first rectangular openings 720. The first rectangular opening 720 does not align to the second rectangular opening 820 along Y-direction.

Figure 13:
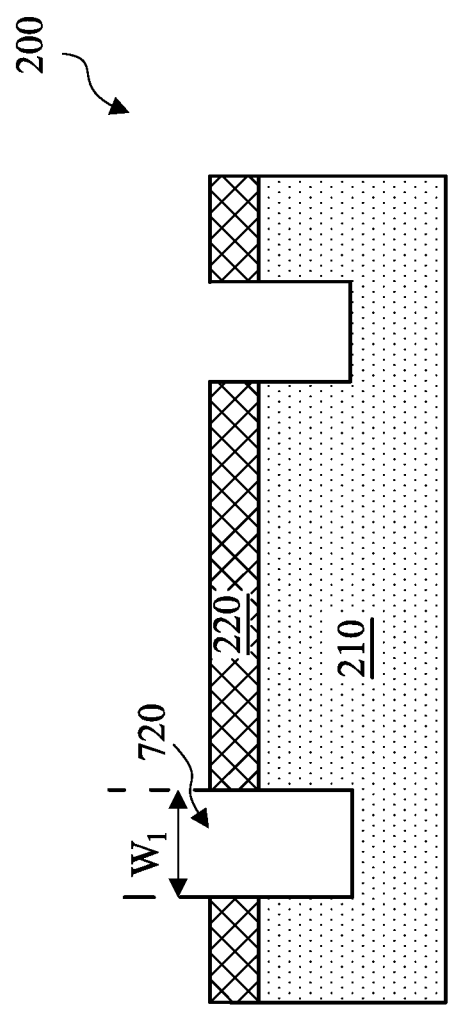

Additional steps can be provided before, during, and after the method 100 or 1000, and some of the steps described can be replaced or eliminated for other embodiments of the method. As an example, after forming the patterned HM 220', the substrate 210 is etched by using the patterned HM 220' as an etch mask, as shown in FIG. 13.

The device 200 may undergo further CMOS or MOS technology processing to form various features and regions known in the art. For example, subsequent processing may form a multilayer interconnection includes vertical interconnects, such as conventional vias or contacts, and horizontal interconnects, such as metal lines. The various interconnection features may implement various conductive materials including copper, tungsten, and/or silicide to provide electrical routings to couple various devices in the substrate 210 to the input/output power and signals.

Based on the above, the present disclosure offers methods for forming a 2D feature by a 1D lithography process. The method employs forming multiple spacers and filling layer to serve as a sub-etch-mask forming the 2D feature. The method demonstrates forming a 2D feature by a relaxed lithography process and with a good critical dimension control.

The present disclosure provides many different embodiments of fabricating a semiconductor device that provide one or more improvements over existing approaches. In one embodiment, a method for fabricating a semiconductor device includes forming a hard mask (HM) mandrel along a first direction over a material layer, forming a first spacer along a sidewall of the HM mandrel, forming a second spacer along a sidewall of the first spacer and forming a patterned photoresist layer having a first line opening over the HM mandrel, the first spacer and the second spacer. The first line opening extends along a second direction that is perpendicular to the first direction. First portions of the HM mandrel, the first spacer and the second spacer are exposed within the first line opening. The method also includes removing the first portion of the first spacer through the first line opening to expose a first portion of the material layer and etching the exposed first portion of the material layer to form a first opening in the material layer by using the exposed first portions of the HM mandrel and the second spacer as a sub-etch-mask.

In another embodiment, a method includes forming a first hard mask (HM) mandrel and a second HM mandrel over a material layer. Both of the first HM mandrel and the second HM mandrel extend along a first direction and the second HM mandrel is spaced apart away from the first HM mandrel along a second direction, which is perpendicular to the first direction. The method also includes forming a first spacer along a sidewall of the first HM mandrel and a second spacer along a sidewall of the second HM mandrel and forming a third spacer along a sidewall of the first spacer and a fourth spacer along a sidewall of the second spacer. The fourth second spacer is spaced apart away from the third spacer by a space. The method also includes forming a filling layer in the space and forming a first patterned photoresist layer having a first line opening over the first and second HM mandrels and the first, second, third and fourth spacers. The first line opening extends along the second direction and first portions of the first and second HM mandrels and the first, second, third and fourth spacers are exposed within the first line opening. The method also includes removing the exposed first portions of the first and second spacers to expose first portions of the material layer and etching the exposed first portions of the material layer to form first and second openings in the material layer by using the exposed first portions of the first and second HM mandrels, the third and fourth spacers and the filling layer as a sub-etch-mask.

In yet another embodiment, a method includes forming a hard mask mandrel over a material layer, forming a first spacer along a sidewall of the hard mask mandrel, forming a second spacer along a sidewall of the first spacer, forming a filling layer along a sidewall of the second spacer and forming a first patterned photoresist layer having a first line opening over the hard mask mandrel, the first and second spacers and the filling layer to expose first portions of the hard mask mandrel, the first and second spacers and the filling layer. The method also includes removing the exposed first portions of the first spacer to expose a first portion of the material layer and etching the first portion of the material layer to form a first opening in the material layer by using the exposed first portions of the HM mandrel, the second spacer and the filling layer as a sub-etch-mask. The method also includes forming a second patterned photoresist layer having a second line opening over the hard mask mandrel, the first and second spacers and the filling layer to expose second portions of the hard mask mandrel, the first and second spacers and the filling layer. The method also includes removing the exposed second portion of the second spacer to expose a second portion of the material layer and etching the second portion of the material layer to form a second opening in the material layer by using the exposed second portions of the HM mandrel, the first spacer and the filling layer as a sub-etch-mask.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A method comprising:
  forming a hard mask (HM) mandrel along a first direction over a material layer;
  forming a first spacer along a sidewall of the HM mandrel;
  forming a second spacer along a sidewall of the first spacer;
  forming a first patterned photoresist layer having a first line opening over the HM mandrel, the first spacer and the second spacer, wherein the first line opening extends along a second direction that is perpendicular to the first direction, wherein first portions of the HM mandrel, the first spacer and the second spacer are exposed within the first line opening;
  selectively removing the first portion of the first spacer through the first line opening to expose a first portion of the material layer;
  etching the exposed first portion of the material layer to form a first opening in the material layer;
  forming a second patterned photoresist layer having a second line opening over the HM mandrel, the first spacer and the second spacer, wherein the second line opening extends along the second direction, wherein the second portions of the HM mandrel, the first spacer, and the second spacer are exposed within the second line opening;
  selectively removing the second portion of the second spacer through the second line opening to expose a second portion of the material layer; and etching the exposed second portion of the material layer to form a second opening in the material layer.

2. The method of claim 1, wherein forming the HM mandrel along the first direction over the material layer includes:
   forming a HM layer over the material layer;
   forming a mandrel photoresist layer over the HM layer;
   patterning the mandrel photoresist layer; and
   etching the HM layer through the patterned mandrel photoresist layer.

3. The method of claim 1, further comprising:
   prior to forming the first patterned photoresist layer, forming another HM mandrel along the first direction over the material layer;
   forming another first spacer along a sidewall of the another HM mandrel;
   forming another second spacer along a sidewall of the another first spacer, wherein the another second spacer is spaced apart away from the second spacer by a space; and
   filling in the space with a filling layer.

4. The method of claim 3, wherein filling in the space with the filling layer includes:
   depositing the filling layer over the space; and
   recessing the filling layer to remove excessive filling layer.

5. The method of claim 3, wherein forming the first patterned photoresist layer having the first line opening over the HM mandrel includes forming the first patterned photoresist layer over the another HM mandrel, the another first spacer, the another second spacer and the filling layer, wherein first portions of the another HM mandrel, the another first spacer, the another second spacer and the filling layer are exposed within the first line opening.

6. The method of claim 5, wherein the exposed first portion of the another first spacer is removed during the selectively removing of the first portion of the first spacer to expose a third portion of the material layer.

7. The method of claim 6, further comprising etching the exposed third portion of the material layer to form a third opening in the material layer.

8. The method of claim 7, wherein the third opening aligns with the first opening along the second direction.

9. The method of claim 7, wherein after the forming of the second patterned photoresist layer, the second portions of the another HM mandrel, the another first spacer, the another second spacer and the filling layer are exposed within the second line opening, wherein the exposed second portion of the another second spacer is removed during the selectively removing of the second portion of the second spacer to expose a fourth portion of the material layer to form a fourth opening in the material layer.

10. The method of claim 9, wherein the second opening aligns with the fourth opening along the second direction.

11. The method of claim 9, wherein the second and fourth openings are spaced apart from the first and the third openings along the first direction, respectively.

12. A method comprising:
   forming a hard mask mandrel over a material layer;
   forming a first spacer along a sidewall of the hard mask mandrel;
   forming a second spacer along a sidewall of the first spacer;
   forming a filling layer along a sidewall of the second spacer;
   forming a first patterned photoresist layer having a first line opening over the hard mask mandrel, the first and second spacers and the filling layer to expose first portions of the hard mask mandrel, the first and second spacers and the filling layer;
   removing the exposed first portion of the first spacer to expose a first portion of the material layer;
   etching the first portion of the material layer to form a first opening in the material layer by using the exposed first portion of the HM mandrel, the second spacer and the filling layer as a sub-etch-mask;
   forming a second patterned photoresist layer having a second line opening over the hard mask mandrel, the first and second spacers and the filling layer to expose second portions of the hard mask mandrel, the first and second spacers and the filling layer;
   removing the exposed second portion of the second spacer to expose a second portion of the material layer; and
   etching the second portion of the material layer to form a second opening in the material layer by using the exposed second portion of the HM mandrel, the first spacer and the filling layer as a sub-etch-mask.

13. The method of claim 12, further comprising removing the HM mandrel, the first and second spacers and filling layer after forming the second opening in the material layer.

14. The method of claim 12, wherein the first line opening and the second line opening do not overlap.

15. A method comprising:
   over a material layer, forming first and second spacers extending in a first direction;
   forming a first patterned photoresist with a first line opening extending in a second direction different from the first direction, the first line opening exposing first portions of the first and second spacers;
   etching the first portions of the first spacers, but not the first portions of the second spacers;
   forming a second patterned photoresist with a second line opening extending in a third direction different from the first direction, the second line opening exposing second portions of the first and second spacers; and
   etching the second portions of the second spacers, but not the second portions of the first spacers.

16. The method of claim 15, further comprising:
   prior to forming the first and second spacers, forming hard mask (HM) mandrels on the material layer along the first direction,
   wherein the first spacers are formed along sidewalls of the HM mandrels and the second spacers are formed along sidewalls of the first spacers.

17. The method of claim 16, further comprising forming filling layers in a space between two adjacent second spacers.

18. The method of claim 17, wherein forming the filling layers includes:
   depositing the filling layers over the space between two adjacent second spacers; and recessing the filling layers to remove excessive filling layers.

19. The method of claim 15, wherein the first direction is perpendicular to the second direction.

20. The method of claim 15, wherein the second direction is the same as the third direction.

* * * * *